United States Patent
Klemmer et al.

(10) Patent No.: US 10,218,338 B1
(45) Date of Patent: Feb. 26, 2019

(54) APERIODIC CLOCK GENERATION WITH SPUR SUPPRESSION

(71) Applicant: TEXAS INSTRUMENTS INCORPORATED, Dallas, TX (US)

(72) Inventors: Nikolaus Klemmer, Dallas, TX (US); Chan Fernando, San Diego, CA (US); Jaimin Mehta, Austin, TX (US); Srinadh Madhavapeddi, Dallas, TX (US); Hamid Safiri, Plano, TX (US); Atul Kumar Jain, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/782,200

(22) Filed: Oct. 12, 2017

(51) Int. Cl.
  *H03K 3/84* (2006.01)
  *H03K 5/1252* (2006.01)
  *H03K 17/16* (2006.01)

(52) U.S. Cl.
  CPC ............ *H03K 3/84* (2013.01); *H03K 5/1252* (2013.01); *H03K 17/16* (2013.01)

(58) Field of Classification Search
  CPC .. H03K 3/00; H03K 3/64; H03K 3/84; H03K 5/1252; H03K 17/16
  USPC .............. 327/164, 291, 299, 551; 331/78
  See application file for complete search history.

(56) References Cited

U.S. PATENT DOCUMENTS 4,571,556 A * 2/1986 Gnerlich ................ A61N 1/08
  331/78

* cited by examiner

*Primary Examiner* — William Hernandez
(74) *Attorney, Agent, or Firm* — Andrew Viger; Charles A. Brill; Frank D. Cimino (57) ABSTRACT

Aperiodic clock generation with clock spur suppression is based on cascaded randomizers, such as for mixed signal devices. A clock generator circuit includes an input node to receive the input periodic clock signal having an input-clock frequency. A first randomizer circuit coupled to receive the input clock signal from the input node, to perform signal randomization to suppress spurious signal content associated with (a) the input clock signal, and (b) the first randomizer circuit, and to generate an intermediate clock signal. A second concatenated randomizer circuit is coupled to receive the intermediate clock signal, to perform signal randomization to suppress spurious signal content associated with (a) the intermediated clock signal, and (b) the second randomizer circuit, and to generate an aperiodic output clock signal having a pre-defined average output-clock frequency that is less than the input-clock frequency. Example randomizers are a delta-sigma divider and a pulse swallower (in any order).

20 Claims, 6 Drawing Sheets

APERIODIC CLOCK GENERATION WITH SPUR SUPPRESSION

BACKGROUND

Technical Field

This Patent Disclosure relates to clock generators, and more particularly to clock spur suppression.

Related Art

In clocked digital logic, the digital circuitry advances on each rising and/or falling clock edge, with voltage transitions on the internal nodes. Denoting an average capacitance $C_{par}$ per each internal node (wiring, parasitic, gate), each transition causes an average energy displacement of $C_{par}*V_{DD}^2$ from the supply node manifested as a current impulse that lasts for the duration of the transition (a few picosec for current CMOS processes), resulting in a common supply power relationship: $P_{supply} = \Sigma_{(active\ nodes)} C_{par}*V_{DD}^2*f_{CLK}$. Assuming a regulated voltage, supply power corresponds to average supply current.

Delays between the clock edge and the individual node transitions will not be the same, corresponding to the logic depth preceding any particular node, i.e., a number of preceding gates that need to change state before the particular node can change state (gate switching). In combinatorial logic sections, glitching can result prior to a node state becoming stable.

Figure 2A:
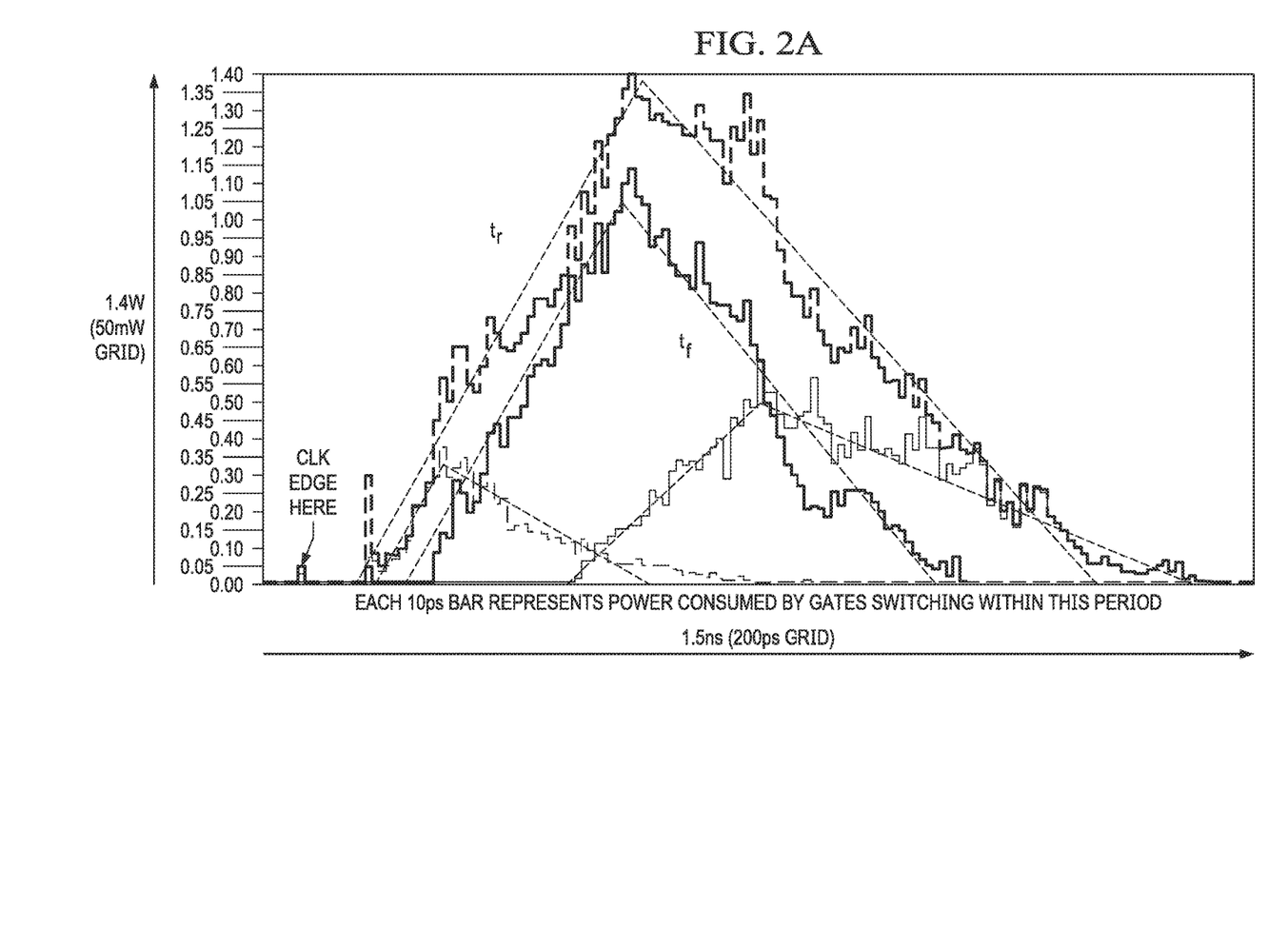
FIG. 2A illustrates, for separate clocked logic blocks, example cumulative triangular-shaped supply current plots, with triangular rise and fall times $t_r$, $t_f$, representing power consumption for logic gate switching during a clock period ($t_r+t_f$)

Depending on the logic circuitry, the starting state, and the number of gates changing state, the cumulative supply current consumed by gate switching during a clock period can exhibit a triangular pulsed shape, starting one gate-delay after the clock edge, and ending when the last node in the logic block has changed state (prior to the end of the clock period). FIG. 2A illustrates, for digital circuitry with separate logic blocks, example triangular supply current pulses with triangular rise and fall times $t_r$, $t_f$.

In integrated mixed-signal devices, the digital logic can act as the "aggressor", corrupting voltage and current signals in the analog/RF section(s) of the IC with noise from the digital logic (digital crosstalk). The impact of this digital crosstalk can be seen as the product of (i) strength of the digital-aggressor logic, (ii) amount of crosstalk to the analog-victim, and (iii) sensitivity of the analog-victim circuitry.

A sub-class of mixed signal ICs are radio-frequency (RF) devices, which are particularly sensitive to digital crosstalk. For example, RF receivers specifications commonly require RF signal sensitivity to be within a few dB of the thermal noise floor. In a common 50 Ohm system with 15.36 kHz signal bandwidth (an LTE/4G sub-carrier bandwidth), the thermal noise floor voltage is at 0.25 µVrms, while the fundamental harmonic of a digital clock signal at a 1.8V supply is 1.14 Vrms, a factor of 133 dB higher, making isolation difficult to achieve. Similar specifications can apply to RF transmitters, requiring suppression of spurious transmissions into adjacent channels.

While this Background information references mixed signal devices, and in particular RF mixed signal, this Patent Disclosure is more generally directed to clock generation with spur suppression.

BRIEF SUMMARY

This Brief Summary is provided as a general introduction to the Disclosure provided by the Detailed Description and Drawings, summarizing aspects and features of the Disclosure. It is not a complete overview of the Disclosure, and should not be interpreted as identifying key elements or features of, or otherwise characterizing or delimiting the scope of, the disclosed invention.

The Disclosure describes apparatus and methods for aperiodic clock generation with clock spur suppression is based on cascaded randomizers, such as for use in mixed signal devices.

According to aspects of the Disclosure, an aperiodic clock generator can include an input node to receive the input periodic clock signal having an input-clock frequency. A first randomizer circuit coupled to receive the input clock signal from the input node, to perform signal randomization to suppress spurious signal content associated with (a) the input clock signal, and (b) the first randomizer circuit, and to generate an intermediate clock signal. A second concatenated randomizer circuit is coupled to receive the intermediate clock signal, to perform signal randomization to suppress spurious signal content associated with (a) the intermediated clock signal, and (b) the second randomizer circuit, and to generate an aperiodic output clock signal having a pre-defined average output-clock frequency that is less than the input-clock frequency. For example, the first and second concatenated randomizers can be a delta-sigma clock divider concatenated with a pulse swallower (in any concatenation order).

Other aspects and features of the invention claimed in this Patent Document will be apparent to those skilled in the art from the following Disclosure.

BRIEF DESCRIPTION OF THE DRAWINGS

FIGS. 2A-2C illustrate, for clocked digital logic, example plots for triangular supply current pulses during a clock period (between clock edges)

DETAILED DESCRIPTION

This Description and the Drawings constitute a Disclosure for aperiodic clock generation with clock spur suppression based on cascaded randomizers, such as can be used in mixed signal devices with digital (clocked) logic and analog circuit blocks, such as for RF RX and/or TX, including describing example embodiments, and illustrating various technical features and advantages.

This Disclosure uses the following nomenclature: "spurious signal content" means an undesirable signal component, with arbitrary frequency/amplitude/phase, or at a harmonic frequency with scaled amplitude/phase, and with a signal power that is greater than a noise specification (noise floor); and "randomizer" means a delta-sigma divider, pulse swallower, clock spreader, or other circuit that generates a noise-like clock signal.

In brief overview, aperiodic clock generation with clock spur suppression is based on cascaded randomizers, such as for mixed signal devices. A clock generator circuit includes an input node to receive the input periodic clock signal having an input-clock frequency. A first randomizer circuit (such as a delta-sigma divider) coupled to receive the input clock signal from the input node, to perform signal randomization to suppress spurious signal content associated with (a) the input clock signal, and (b) the first randomizer circuit, and to generate an intermediate clock signal. A second concatenated randomizer circuit (such as a pulse swallower) is coupled to receive the intermediate clock signal, to perform signal randomization to suppress spurious signal content associated with (a) the intermediated clock signal, and (b) the second randomizer circuit, and to generate an aperiodic output clock signal having a pre-defined average output-clock frequency that is less than the input-clock frequency. The first randomizer circuit can be selected to suppress spurious signal content that is complementary to the spurious signal content suppressed by the second randomizer circuit. Concatenation order is optional. An example pulse swallower can provide swallow-pulse position randomization based on one of: barrel-shift position offset and random position offset. An example delta-sigma divider can include an N (integer or fractional) divider, and a delta-sigma modulator, including a delta-sigma loop, coupled to the N divider, and can include an interleaver coupled between the delta-sigma modulator and the N divider, and/or an LFSR (linear feedback shift register) dither-noise generator included in the delta-sigma loop. Clock phasing can be used to further spread the aperiodic clock signal for input to digital logic blocks.

Figure 1:
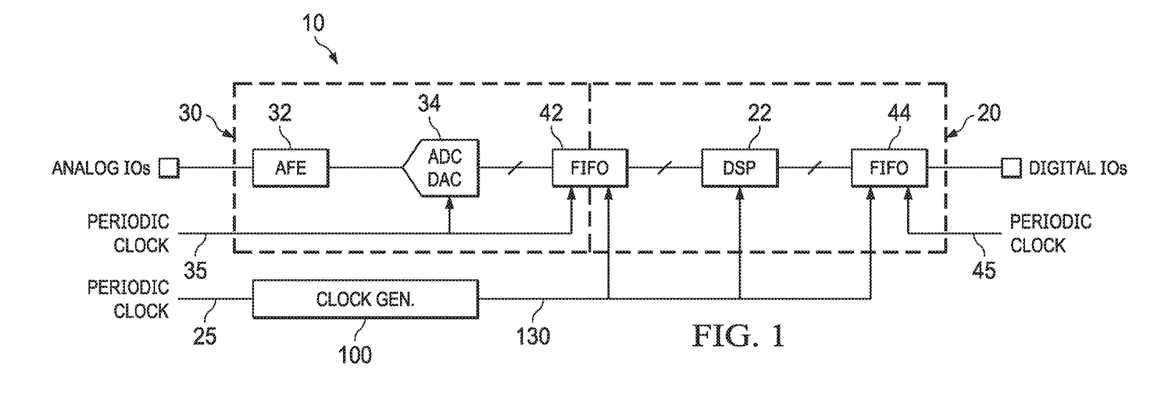
FIG. 1 illustrates an example mixed signal RF transceiver [10], including digital logic [20] and analog circuitry [30], and including a digital-domain clock generator 100 for generating an aperiodic clock with clock spur suppression, based on a cascaded, clock-edge randomizing structure according to this Disclosure.

FIG. 1 illustrates an example mixed signal RF transceiver circuit 10, including digital logic 20, and analog circuitry 30. Digital logic 20 is represented by a DSP 22. Analog circuitry is represented by an AFE (analog front end) 32 and ADC/DAC 34. Digital logic 20 interfaces to the analog circuitry 30 and the digital IOs through FIFO buffers 42 and 44.

A clock generator 100 receives a periodic clock 25, and supplies an aperiodic clock signal 130 to the digital domain 20. For example, the periodic input clock signal can be generated by an external/integrated periodic clock generator, such as a crystal oscillator, or, if higher frequencies are required, a phase-locked-loop (PLL).

Clock generator 100 generates the aperiodic clock signal 130 with spurious signal suppression based on a cascaded clock-edge randomizing structure according to this Disclosure. For the example mixed signal application, aperiodic clock generation with spurious signal suppression reduces digital crosstalk in a frequency dependent way so as to provide spurious signal isolation at the frequencies of interest, for example, for RF communications.

FIFO buffers 42/44 are required to interface the digital logic 20, clocked by the aperiodic clock 130 from clock generator 100, to the periodically clocked perimeter circuitry. In particular, FIFO 42 interfaces the aperiodic digital clock domain logic 20 to the periodic analog clock domain, interfacing the instantaneous, cumulative time difference between the n-th edge of the analog-domain periodic clock 35, and the corresponding edge of the frequency randomized, aperiodic clock 130 generated by clock generator 100.

Note that the minimum depth of this FIFO buffer is given by the maximum time difference between the aperiodic and periodic clocks, divided by the average clock signal period (plus margin). To minimize signal path latency, the FIFO depth should be minimized.

Figure 2B:
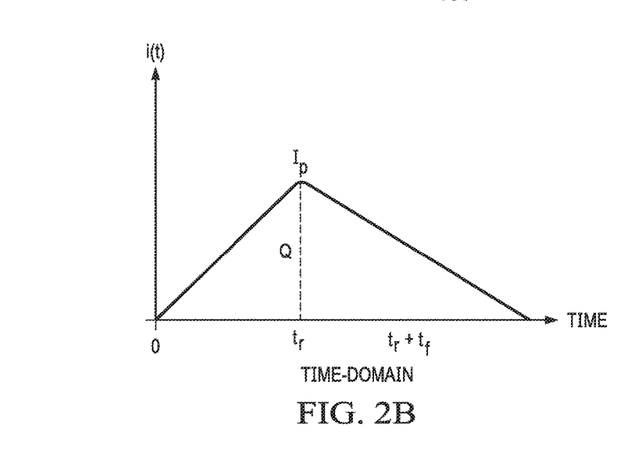
FIGS. 2B-2C are respectively example time domain and frequency domain plots for an illustrative triangular supply current pulse (with period $t_r+t_f$), and the associated spectral content (including envelope and oscillating terms, and a corner frequency).
Figure 2C:
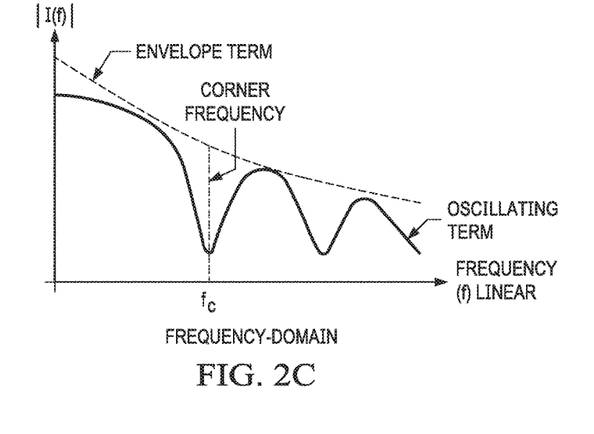

FIGS. 2A-2C illustrate, for clocked digital logic, example plots for triangular supply current pulses during a clock period (between clock edges).

FIG. 2A illustrates, for separate clocked logic blocks, example cumulative triangular-shaped supply current plots, with triangular rise and fall times $t_r$, $t_f$. The triangular shaped current pulse plots represent power consumption for logic gate switching during a clock period ($t_r+t_f$).

FIGS. 2B-2C are respectively example time domain and frequency domain plots. FIG. 2B illustrates a triangular supply current pulse (with period $t_r+t_f$) in the time domain, and FIG. 2C illustrates the associated spectral content, including envelope and oscillating terms, and a corner frequency.

The triangular shaped cumulative current pulse spectrum includes an envelope term, which decreases with increasing frequency and rise/fall times, and an oscillating term. The oscillating term leads to a first null at $f_c=\min(1/t_R,1/t_F)$.

Considering the fact that ($t_R$, $t_F$) are in the 100's ps range, $f_c$ will be in the 10's GHz range, or, in other words, the envelope term dominates.

Figure 3:
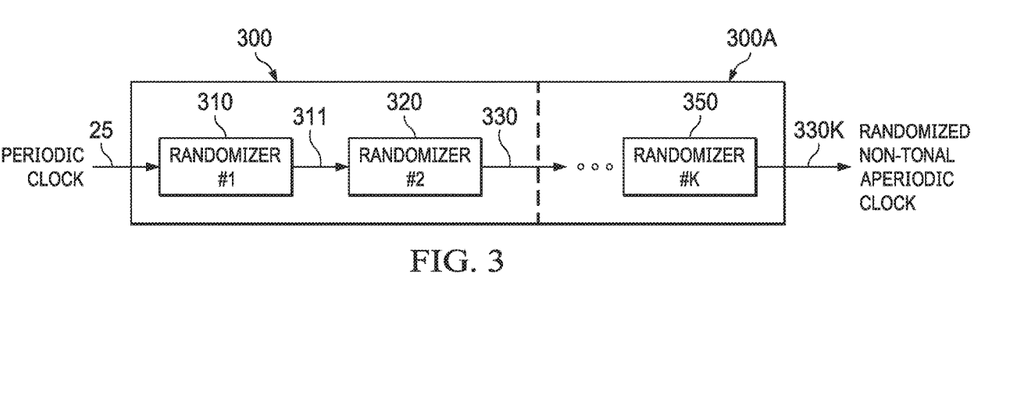
FIG. 3 illustrates an example architecture [300] for aperiodic clock generation with clock spur suppression based on cascaded clock-edge randomization, using first and second cascaded randomizers [310, 320], where the first randomizer [310] receives an input periodic clock signal [25], and generates an intermediate clock signal [311], with randomization to suppress spurious signal content, for input to the second randomizer [320] which generates, with randomization to further suppress spurious signal content, an aperiodic output clock [330].

FIG. 3 illustrates an example architecture 300 for aperiodic clock generation with clock spur suppression based on cascaded clock-edge randomizing with at least first and second cascaded randomizers 310, 320. The first randomizer 310 receives the input periodic clock signal 25, and generates an intermediate clock signal 311, with randomization to suppress spurious signal content associated with the input clock signal and the first randomizer circuit.

The randomized intermediate clock signal 311 is input to the second randomizer 320, which generates an aperiodic output clock 330. The second randomizer effects further suppression of spurious signal content associated with the input intermediate clock signal 311 and the second randomizer circuit. The aperiodic output clock 330 is generated with an average output-clock frequency less than the frequency of the input periodic clock 25.

The cascaded clock-edge randomizer structure and method according to this Disclosure can be extended to more than two cascaded randomizing blocks to further improve spreading properties, reducing tonal clock signal voltage or current components, and/or improve FIFO depths at periodic-clock interfaces. Such extension is represented by a Kth randomizer 350, generating an aperiodic output clock 330K.

Figure 4:
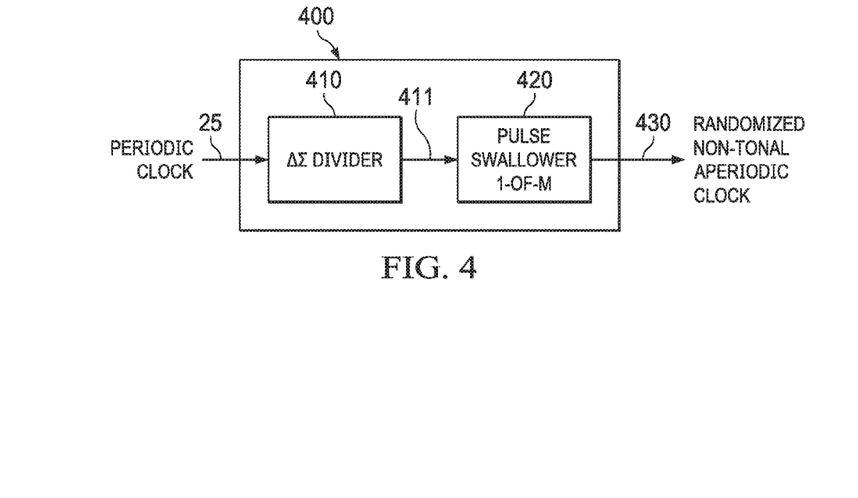
FIGS. 4 and 5 illustrate an example aperiodic clock generator [400/500] with clock spur suppression based on cascaded clock-edge randomization, implemented with an example delta-sigma divider [410/510] concatenated with an example pulse swallower (1-of-M) [420/520], the delta-sigma divider to receive an input periodic clock signal [25], and generate, with randomization to suppress spurious signal content, a spread intermediate clock signal [411/511], with randomization to suppress spurious signal content, for input to the pulse swallower, which generates, with pulse-swallow randomization to further suppress spurious signal content, an aperiodic output clock [430/530].
Figure 5:
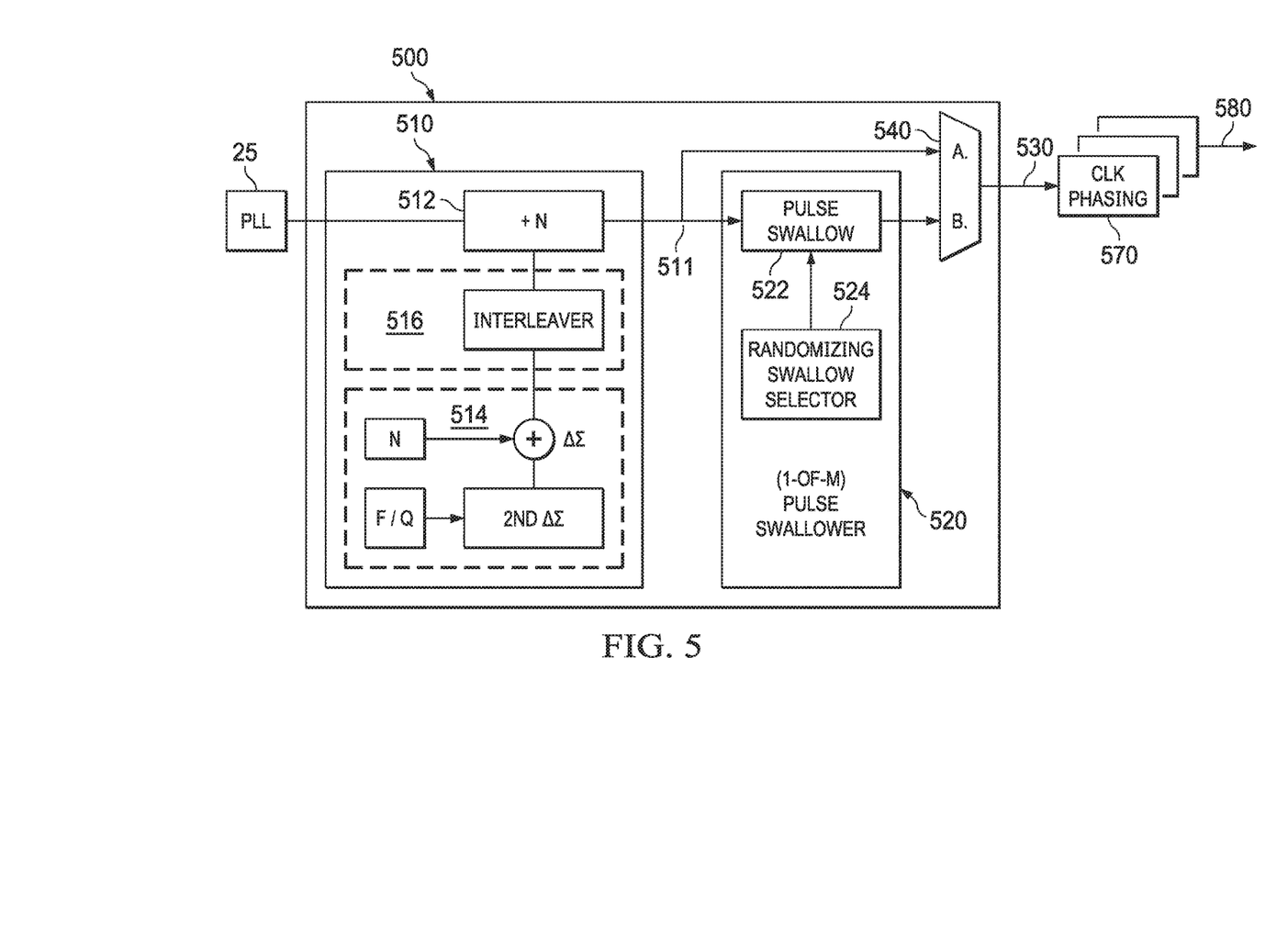

FIGS. 4 and 5 illustrates an example aperiodic clock generator with clock spur suppression based on cascaded randomizers, implemented with an example delta-sigma divider, concatenated with an example randomizing pulse swallower. Note that the order of the cascaded randomizers can be changed.

FIG. 4 illustrates an example aperiodic clock generator architecture 400 with clock spur suppression based on cascaded randomizers implemented with a delta-sigma divider 410 in cascade with a randomizing pulse swallower (1-of-M) 420. The delta-sigma divider receives the input periodic clock signal 25, and generates a randomized (spread) intermediate clock signal 411 (with spurious signal suppression), for input to the randomizing pulse swallower 420. Pulse swallower 420 generates an aperiodic output clock 430. The example pulse swallower is configurable (for example, by a register setting) for swallow-pulse randomization of the deleted swallow-pulse within a M-length pulse swallow period, such as by barrel-shift or random offset, to further suppress spurious signal content.

The aperiodic output clock 430 is generated with an average output-clock frequency less than the input-clock frequency. That is, the average output-clock frequency is reduced by the delta-sigma divider 410 by the divide factor, and then further reduced by the pulse swallower by the (M−1)/M swallow factor.

FIG. 5 illustrates the example aperiodic clock generator 500 with clock spur suppression based on a cascaded example delta-sigma divider 510 and example randomizing pulse swallower (1-of-M) 520. In this example, a PLL 25A is used to generate the input periodic clock signal 25, with an accurate 50 percent duty cycle at a frequency $f_{PLL}$.

The delta-sigma divider 510 receives the input periodic clock 25, and generates a randomized (spread) intermediate clock signal 511 (with spurious signal suppression), for input to the randomizing pulse swallower (1-of-M) 520. The example delta-sigma divider 510 includes a fractional N divider 512 with an example second order delta-sigma modulator 514. The example delta-sigma divider 510 further includes an optional interleaver 516.

The randomizing pulse swallower (1-of-M) 520 receives the randomized intermediate clock signal 511, and generate an aperiodic output clock 430. The example pulse swallower 520 includes a swallow circuit with a swallow selector, to configure the pulse swallower either for pulse swallowing with a constant-offset, or for swallow-pulse randomization (such as by barrel-shift or random swallow-pulse offset) to further suppress spurious signal content.

The aperiodic output clock 530 is generated with an average output-clock frequency less than the input-clock frequency. That is, a higher frequency input clock 25 undergoes successive, non-periodic reduction of the clock frequency from intermediate clock 511 to the aperiodic output clock 530: the delta-sigma divider reduces the input periodic clock frequency by the divide factor $f_{PLL}/(N+F/Q)$ to the intermediate clock average frequency, which is further reduced in the pulse swallower by the swallow factor (M−1)/M, so that the average output clock frequency is reduced from the input periodic clock frequency by: $f_{PLL}/(N+F/Q)*(M-1)/M$. As a result, the average output clock frequency can be controlled to a pre-defined value, and the instantaneous output frequency varies within a pre-defined (aperiodic) range.

A pulse swallower with a periodic input will generate an output signal that is randomized, but can still include spurious tonal content at the input (periodic) frequency (M−1 pulses of the M-length sequence are still present). The concatenated delta-sigma divider can provide a randomized output that suppresses this spurious tonal content associated with the periodic input frequency (either at the input or output of the pulse swallower, depending on concatenation order).

That is, the example aperiodic clock generator 530 with cascaded delta-sigma divider 510 and randomizing pulse swallower 520 performs complementary spurious signal content suppression. By the example complementary spurious signal content suppression, a first randomizer performing randomization to suppress spurious signal content that is substantially not suppressed by a second randomizer, for example, the delta-sigma divider randomizes input signal spurious signal content that is substantially not randomized by the pulse swallower (i.e., spurious signal content at the input clock frequency because of the M−1/M pulse transmission aspect of a 1-of-M pulse swallower.

The aperiodic clock 530 generated by the aperiodic clock generator 510 is input to an example clock phasing unit 570. Clock phasing unit 570 generates N equal clock signals 580, delayed relative to each other by successive 1/N-th of a clock period, with the effect of reducing the amplitude of the harmonic content main clock frequency. Clock phasing can be used to provide N separate clocks to enable dividing the digital logic block into N smaller blocks, separately clocked by the N phase-shifted clocks, with approximately equal power consumption (i.e. approximately equal supply current transients).

Figure 6:
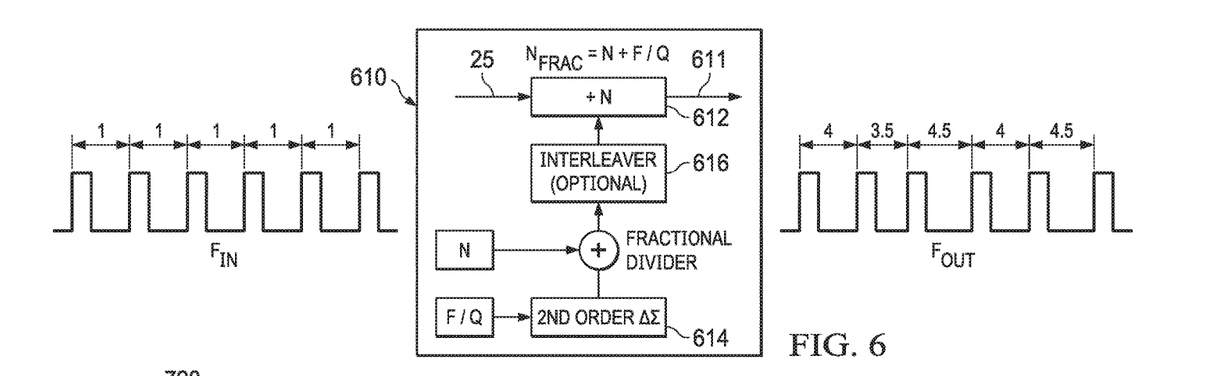
FIG. 6 illustrates an example delta-sigma divider [610], including an N fractional divider N+F/Q [612], and a ($2^{nd}$ order) delta-sigma modulator [614], implemented with an (optional) interleaver [616] at the output of the delta-sigma modulator.

FIG. 6 illustrates an example delta-sigma divider 610, including an example N fractional divider N+F/Q 612, and an example $2^{nd}$ order delta-sigma modulator 614, implemented as $2^{nd}$ order. The delta-sigma modulator 610 can include a LFSR (linear feedback shift register) to introduce LFSR-dither noise at the quantizer input to suppress residual limit cycles.

An optional interleaver 616 can be cascaded with the delta-sigma modulator 614 to suppress quantization noise from the delta-sigma, but sufficiently scrambles the division ratio sequence to suppress residual limit cycles (after LFSR noise has been added to the quantizer input already).

The delta-sigma divider input parameters are (N,F) for the integer and numerator of the fractional, average divide ratio. The denominator (Q) is a design parameter of the digital delta-sigma, for example $Q=2^{16}$. The fractional value F/Q= [−0.5, . . . , 0.5] is encoded by the delta-sigma into a [−1, 0, +1] output sequence that, on average, approaches the fractional F/Q value. The delta-sigma feedback loop acts in such a way that the cumulative error remains minimized, given the unit-quantization step. Since the fractional input value F is static, the delta-sigma output sequence would be periodic (period length determined by the input value itself), introducing spurs in the output. From above, an LFSR noise-generator can be included to break the periodicity in the delta-sigma loop.

Note that it is important to define/control maximum instantaneous frequency, as the digital logic needs to be timing closed up to that frequency (i.e. the longest digital signal path delay needs to settle to its final state within this shortest clock period. For example, for instantaneous division ratios of [N−1, N, N+1], the highest instantaneous output frequency clocking the attached digital circuitry is $f_{PLL}/(N-1)$.

The spectrum of the generated intermediate clock 511 will exhibit tones at the output frequency and harmonics. Even with LFSR-noise injected into the delta-sigma loop, residual tones can appear in the spectrum of the clock waveform. The optional interleaver 616 can be used to further scramble the delta-sigma intermediate clock output 611, such that the residual periodicities are converted to a noise-like signal.

Figure 7:
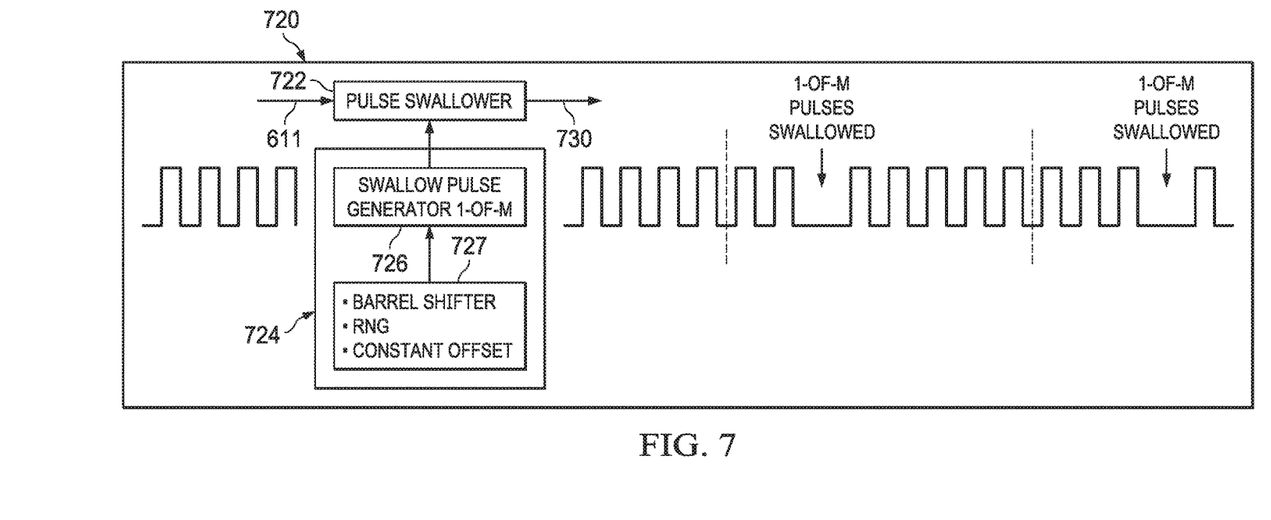
FIG. 7 illustrates an example (1-of-M) pulse swallower [720], including a swallow circuit [722] and a swallow selector (1-of-M) [724], implemented with a swallow pulse generator [726] configurable [727] for swallow-pulse randomization based on barrel-shift and random-position (RNG) offset for the swallow (deleted) pulse.

FIG. 7 illustrates an example randomizing (1-M) pulse swallower 720, including a swallower 722, and a swallow selector 724. The example swallow selector 724 can be implemented with a swallow pulse generator 726 configurable 727 either for pulse swallowing with a constant offset, or for swallow-pulse randomization of the missing/deleted swallow-pulse position, for example, based on barrel-shift or random-position (RNG) offset.

Pulse swallower 720 receives the randomized (spread) intermediate clock 611 from the cascaded delta-sigma divider (FIG. 6, 610). The delta-sigma divider generates the intermediate clock 611 with a randomized, noise-like clock spectrum that suppresses the tone that would otherwise appear in the cumulative current spectrum of the pulse swallower 720 at the swallower input frequency and its harmonics.

Based on an input periodic clock (FIG. 6, 25) with frequency $f_{PLL}$, the average frequency of the intermediate clock 611 generated by the delta-sigma divider (FIG. 6, 610) and input to pulse swallower 720 is: $f_{PLL}$ (N+F/Q) The 1-of-M pulse swallower 720 generates the aperiodic output clock 730 with an average frequency of: $f_{PLL}/(N+F/Q)*(M-1)/M$.

That is, for each pulse swallow period of M-length, 1-of-M pulses are removed from the output sequence of the aperiodic output clock 730, so that the average output frequency is (M−1)/M times the input periodic frequency, but with (M−1) periods of the output being simply a copy of the input sequence. When a periodic sequence of clock periods has 1 in every sequence of M periods removed, the resulting average output frequency will be lowered by the factor (M−1)/M, so that the main clock spur energy remains at the input clock frequency, but the output frequency is shifted by the (M−1)/M factor.

This pulse swallow effect on the generated aperiodic output clock can be used beneficially in cases where the n-th harmonic of the input periodic clock (FIG. 6, 25) falls within the band of interest of the victim circuit (such as the analog circuitry 20 of FIG. 1). Shifting the input periodic clock frequency up, and dividing it with the 1-of-M pulse swallower 720, effectively moves the n-th harmonic to n*M/(M−1) the original input frequency $f_{PLL}$, thereby avoiding the victim band of interest.

Note that, while the spectrum of the missing pulse is periodic at 1/M-th of the swallower input frequency, and may fall into the victim band, the energy of this spur is lowered as M increases. Further, for the example pulse swallower 720, the missing-pulse spurs are spread by randomizing the swallow-pulse position within the M-pulse sequence, i.e., by swallow-pulse randomization implemented by swallow selector 724.

The example swallow selector 724 implements two swallow-pulse randomization schemes for the missing/deleted swallow-pulse position: barrel-shifting offset and random-position offset. Barrel-shifting offset advances the position of the missing-pulse by-one every within every M-sequence of input pulses, so that the average output frequency is maintained, but the phase of the missing-pulse tone is varied (M values). Overall, the periodicity of the missing-pulse is extended from M input cycles (for constant position swallow) to $M^2$ input cycles, i.e. $(M-1)^2$ output cycles, so that the energy in any one residual output tone in constant position swallow is spread over M-tones, providing further 10*log (M) suppression, and further approaching the goal of turning spurious tones into "noise" at the clock generator output. Random-position offset swallowing aims to completely break the periodicity in the output clock sequence, and realize that benefit also in the cumulative supply current spectrum. Randomization can be obtained via an integrated LFSR randomizer that generates a uniformly distributed number [1, . . . ,M] every M input clock cycles.

In addition, the example swallow selector 724 can configure the pulse swallower 720 for constant-offset pulse swallow. For constant-offset pulse swallow, the missing-pulse repeats periodically every N input cycles, generating tones at $f_{IN}/M=f_{OUT}(M/(M-1))/M=f_{OUT}/(M-1)$, albeit at a lower amplitude.

Figure 8:
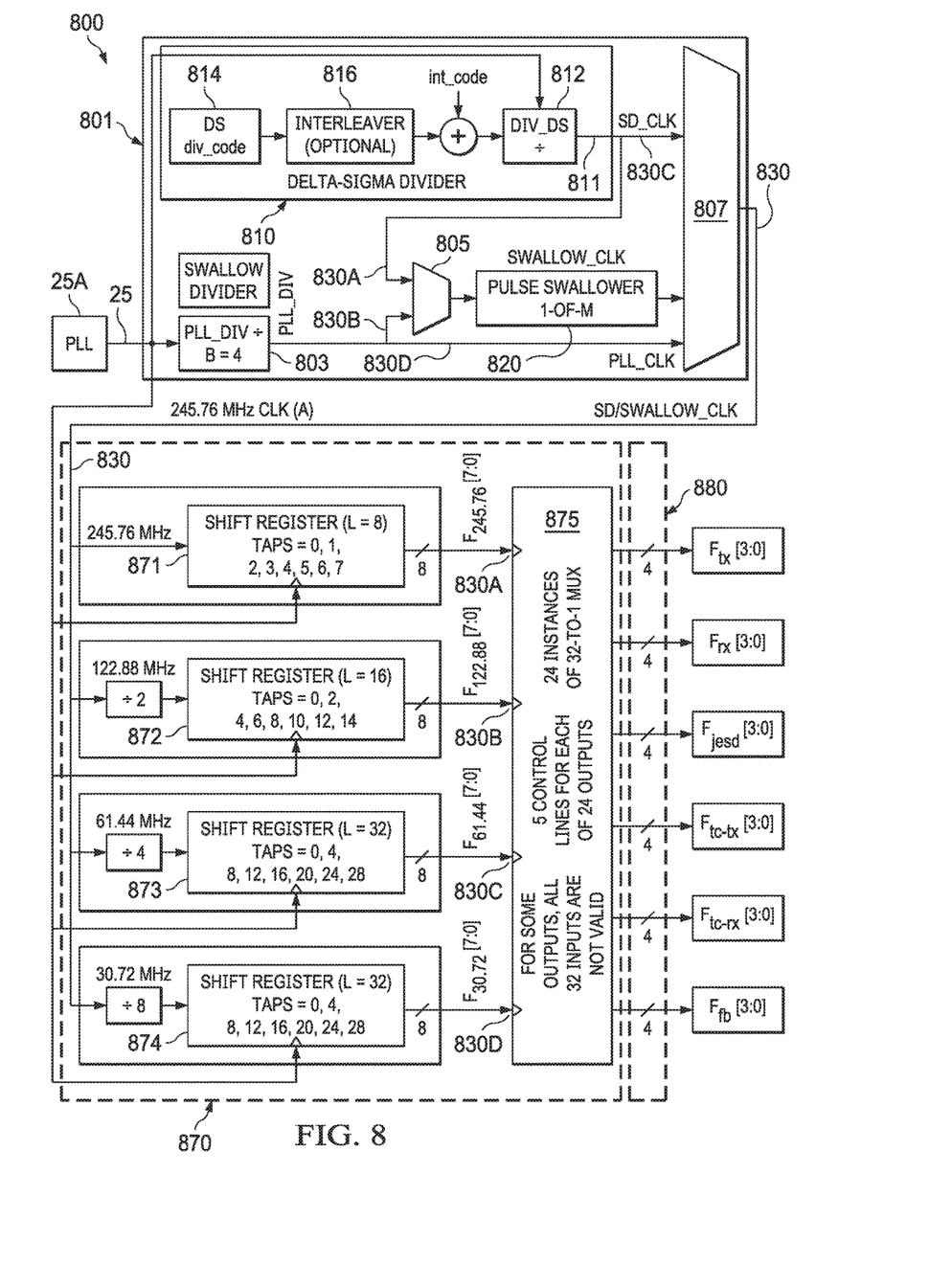
FIG. 8 illustrates an example digital clock generator including an example aperiodic clock generator [800] with clock spur suppression based on cascaded randomizers [810, 820] providing an aperiodic clock signal [830] to an example clock phasing unit [870], the aperiodic clock generator implemented with an example randomizing delta-sigma divider [810] concatenated with an example randomizing pulse swallower (1-M) [820].

FIG. 8 illustrates an example digital clock generator 800 including an example clock generation unit 801 and example clock phasing unit 870.

Clock generation unit 801 is implemented with an example delta-sigma divider 810 in cascade with an example (1-M) pulse swallower 820. The delta-sigma divider 810 receives the input periodic clock signal 25, generated by a PLL 25A. Delta-sigma divider 810 generates a randomized (spread) intermediate clock signal 811 for input to the randomizing pulse swallower 820. Pulse swallower 820 implements (1-of-M) pulse-swallow randomization to further suppress spurious signal content, generating an aperiodic output clock 830 with an average output-clock frequency less than the input-clock frequency.

Delta-sigma divider 810 is configured and operable as described in connection with FIGS. 4-6. Pulse swallower 820 is configured and operable as described in connection with FIGS. 4-5,7.

Clock generation unit 801 is selectively operable in four clock modes: aperiodic clock generation with cascaded clock edge randomization according to this Disclosure, and three single-divider modes. The aperiodic clock mode (based on cascaded clock edge randomization) is designated SD/SWALLOW_CLK. The single-divider modes are: (a) pulse-swallow divide designated SWALLOW_CLK, (b) delta-sigma divide designated SD_CLK, and (c) constant divide designated PLL_CLK.

Clock generation unit 801 includes a PLL_DIV divider 803, and two multiplexers: (a) a swallow mux 805, and (b) a clock output mux 807. PLL_DIV 803 is coupled to receive the input periodic clock 25 from PLL 25A, and selectively output one of four PLL divide values PLL_DIV (B=0-3). The swallow mux 805 selects for input to the pulse swallower 820 either: (a) the delta-sigma divider output 811 as mux input 830A, or (b) PLL_DIV as mux input 830B. Clock output mux 807 selects for output as clock generator output 830 either: (a) SD_CLK from the delta-sigma divider 810 (divider output 811) which is mux input 830C, or (b) PLL_CLK from the PLL_DIV divider (PLL_DIV) as mux input 830D, or (c) the output of the pulse swallower 820, which is either the SD/SWALLOW_CLK or SWALLOW_CLK. Pulse swallower 820 selectively outputs to the clock output mux 807 either SD/SWALLOW_CLK or SWALLOW_CLK depending on the input to the pulse swallower as selected by swallow mux 805: (a) for SD/SWALLOW_CLK, mux input 830A from the delta-sigma divider (intermediate clock 811), or (b) for SWALLOW_CLK, mux input 830B from the PLL divider (PLL_DIV).

As illustrated, the example clock generator unit 801 is in SD/SWALLOW_CLK mode, generating an aperiodic output clock based on cascaded clock-edge randomization, with swallow mux 805 selecting for input to the pulse swallower 820, the randomized intermediate clock output 811 from the delta-sigma divider, and with the clock output mux 807 selecting as the clock generator output 830, the output of pulse swallower 820, the aperiodic output clock SD/SWALLOW_CLK.

For the example clock generator 800, the output of the clock generator unit 801 is input to a clock phasing unit 870. Clock phasing unit 870 includes four channels A-D. Channel A receives the SD/SWALLOW_CLK (as illustrated, 245.76 MHZ; Channels B-D include respectively dividers ÷2, ÷4, ÷8 to divide the SD/SWALLOW_CLK. Channels A-D include respective shift registers 871-874 clocked by the PLL clock 25, and a selector 875 to select the appropriate clock for output from the clock generator 800.

This Disclosure sets forth example designs and applications illustrating aspects and features of the invention, and does not limit the scope of the invention, which is defined by the claims. Known circuits, connections, functions and operations are not described in detail to avoid obscuring the principles and features of the invention. These example embodiments and applications, can be used by ordinarily skilled artisans as a basis for modifications, substitutions and alternatives to construct other embodiments, including adaptations for other applications.

The invention claimed is:

1. A circuit for generating an aperiodic clock signal from a periodic input clock signal, comprising
an input node to receive the input periodic clock signal having an input-clock frequency;
a first randomizer circuit coupled to receive the input periodic clock signal from the input node, and:
to perform signal randomization to suppress spurious signal content associated with the input periodic clock signal, and the first randomizer circuit, and
to generate an intermediate clock signal; and
a second randomizer circuit coupled to receive the intermediate clock signal,
to perform signal randomization to suppress spurious signal content associated with the intermediate clock signal, and the second randomizer circuit, and
to generate the aperiodic clock signal having a pre-defined average output-clock frequency that is less than the input-clock frequency.

2. The circuit of claim 1, wherein:
the first randomizer circuit to suppress spurious signal content that is complementary to the spurious signal content suppressed by the second randomizer circuit.

3. The circuit of claim 2, wherein either the first or second randomizer circuit is a pulse swallower.

4. The circuit of claim 3, wherein the pulse swallower uses a swallow-pulse position randomization based on one of: barrel-shift position offset and random position offset.

5. The circuit of claim 1, wherein the second randomizer circuit is a delta-sigma divider.

6. The circuit of claim 5, the delta-sigma divider including:
an N divider that is integer or fractional; and
a delta-sigma modulator, including a delta-sigma loop, coupled to the N divider;
and including at least one of:
an interleaver coupled between the delta-sigma modulator and the N divider, and
an LFSR (linear feedback shift register) dither-noise generator included in the delta-sigma loop.

7. The circuit of claim 1, further comprising:
clock phasing circuitry coupled to receive the aperiodic clock signal and to generate multiple phases of the aperiodic clock signal.

8. A circuit including clock generation circuitry for generating an aperiodic clock signal from a periodic input clock signal, comprising
an input node to receive an input analog signal;
an input clock node to receive the input periodic clock signal having an input-clock frequency;
analog circuitry to receive the input analog signal, and to generate a digital signal based on the input analog signal, and to operate with the input periodic clock signal;
digital circuitry to receive the digital signal, and to generate a digital output signal based on the digital signal, and to operate with at least one aperiodic clock signal;
clock generation circuitry to receive a periodic clock signal corresponding to the input periodic clock signal, and including:
a first randomizer circuit coupled to receive the input periodic clock signal from the input node, and:
to perform signal randomization to suppress spurious signal content associated with the input periodic clock signal, and the first randomizer circuit, and
to generate an intermediate clock signal; and
a second randomizer circuit coupled to receive the intermediate clock signal, and:
to perform signal randomization to suppress spurious signal content associated with the intermediate clock signal, and the second randomizer circuit, and
to generate the aperiodic clock signal having a pre-defined average output-clock frequency that is less than the input-clock frequency.

9. The circuit of claim 8, wherein:
the first randomizer circuit to suppress spurious signal content that is complementary to the spurious signal content suppressed by the second randomizer circuit.

10. The circuit of claim 9, wherein either the first or second randomizer circuit is a pulse swallower.

11. The circuit of claim 10, wherein the pulse swallower uses a swallow-pulse position randomization based on one of: barrel-shift position offset and random position offset.

12. The circuit of claim 8, wherein the second randomizer circuit is a delta-sigma divider.

13. The circuit of claim 12, wherein the delta-sigma divider includes
an N divider that is integer or fractional; and
a delta-sigma modulator, including a delta-sigma loop, coupled to the N divider;
and including at least one of:
an interleaver coupled between the delta-sigma modulator and the N divider, and
an LFSR (linear feedback shift register) dither-noise generator included in the delta-sigma loop.

14. The circuit of claim 8, further comprising:
clock phasing circuitry coupled to receive the aperiodic clock signal and to generate multiple phases of the aperiodic clock signal.

15. A method for generating an aperiodic clock signal from a periodic input clock signal, comprising
receiving the periodic input clock signal;
performing, in a first randomizer, first signal randomization on the periodic input clock signal to suppress spurious signal content associated with the input periodic clock signal, and the first randomizer;
generating an intermediate clock signal;
performing, in a second randomizer, second signal randomization to suppress spurious signal content associated with the intermediate clock signal, and the second randomizer; and
generating the aperiodic clock signal having a pre-defined average output-clock frequency that is less than the input-clock frequency.

16. The method of claim 15, wherein:
the first signal randomization is performed to suppress spurious signal content that is complementary to the spurious signal content suppressed by the second signal randomization.

17. The method of claim 16, wherein either the first or second randomization is performed based on pulse swallowing.

18. The method of claim 17, wherein pulse swallowing comprises using a swallow-pulse position randomization based on one of: barrel-shift position offset and random position offset.

19. The method of claim 15, wherein the signal second randomization is performed using:
a delta-sigma divider that includes a delta-sigma modulator, including a delta-sigma loop, coupled to an N divider;
and including at least one of:
an interleaver coupled between the delta-sigma modulator and the N divider, and
an LFSR (linear feedback shift register) dither-noise generator included in the delta-sigma loop.

20. The method of claim 15, further comprising:
performing clock phasing on the aperiodic clock signal to generate multiple phases of the aperiodic clock signal.

\* \* \* \* \*